United States Patent [19]

Speiser et al.

[11] 4,282,579
[45] Aug. 4, 1981

[54] DISCRETE FOURIER TRANSFORM SYSTEM USING THE DUAL CHIRP-Z TRANSFORM

[75] Inventors: Jeffrey M. Speiser; Harper J. Whitehouse, both of San Diego, Calif.

[73] Assignee: The United States of America as represented by the Secretary of the Navy, Washington, D.C.

[21] Appl. No.: 86,967

[22] Filed: Oct. 22, 1979

[51] Int. Cl.³ .................... G06F 15/332; G06G 7/12
[52] U.S. Cl. .................................. 364/726; 364/725; 364/826; 364/827
[58] Field of Search .............. 364/725, 726, 826, 827

[56] References Cited

U.S. PATENT DOCUMENTS

| | | | |
|---|---|---|---|
| 3,900,721 | 8/1975 | Speiser et al. | 364/726 X |
| 3,965,343 | 6/1976 | Speiser et al. | 364/726 |
| 4,010,360 | 3/1977 | Alsup et al. | 364/726 X |
| 4,068,311 | 1/1978 | Whitehouse et al. | 364/827 |

*Primary Examiner*—Jerry Smith
*Attorney, Agent, or Firm*—Richard S. Sciascia; Ervin F. Johnston; John Stan

[57] ABSTRACT

A transform system provides a real-time implementation of the discrete Fourier transform (DFT) of length N, the system being useful in sonar and radar signal processing. The input signal $g_n$, $0 \leq n \leq N-1$, comprises a discrete signal, generally complex, of N samples.

The system comprises an input for receiving the input signal $g_n$ and convolving in a first, input, convolver with a signal represented by the function $e^{i\pi n^2/N}$, to result in a first modified signal at the output of the first convolver. Means are provided for generating the signal $e^{-i\pi n^2/N}$. A multiplier receives the first modified signal and the signal $e^{-i\pi n^2/N}$ and multiplies these two signals its output being a second modified signal.

A second, output, convolver, whose input is connected to the output of the multiplier, convolves the output signal from the multiplier with a signal represented by the function $e^{i\pi n^2/N}$, to result in a discrete Fourier transformed (DFT) signal at the output. The output signal is generally a complex signal, having a real part and an imaginary part. One of the three chirps, represented by the two signals $e^{i\pi n^2/N}$ and the signal $e^{-i\pi n^2/N}$, is multiplied by a factor of $(1-i)$ either explicitly or in a summer for the corresponding complex operation in order to obtain the correct output phase.

7 Claims, 8 Drawing Figures

NOTE: THE EMBODIMENT MAY BE SIMPLIFIED BY NOTING THAT
  (a) $(1+i)(1-i) = 2$   and   (b) $(p+iq)(1-i) = (p+q) + i(q-p)$ <u>DUAL CZT of FIG. 2B, WITH THE VARIOUS PARAMETERS SPECIFIED.</u>

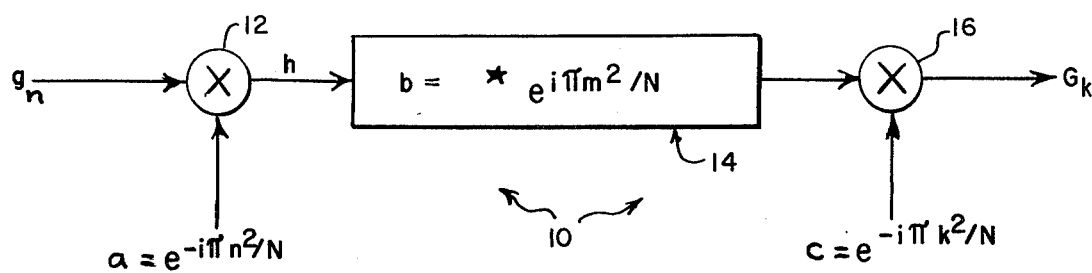
FIG. 1. (PRIOR ART) CHIRP TRANSFORM IMPLEMENTATION OF THE DFT.
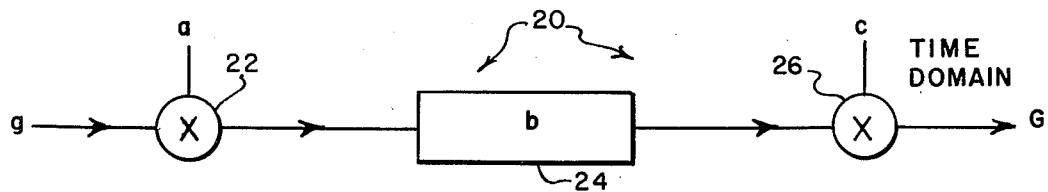
FIG. 2A. TIME DOMAIN INTERPRETATION OF CZT.
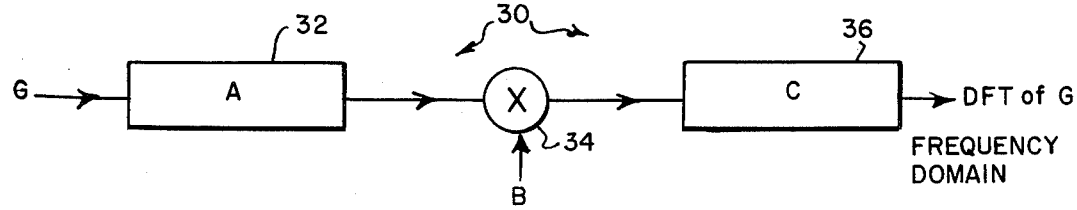
FIG. 2B. FREQUENCY DOMAIN INTERPRETATION OF CZT.
FIG. 2. CZT IN THE TIME DOMAIN AND IN THE FREQUENCY DOMAIN
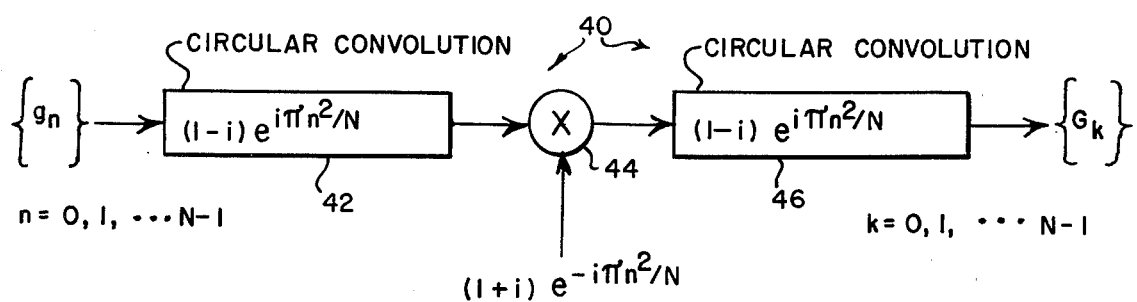
NOTE: THE EMBODIMENT MAY BE SIMPLIFIED BY NOTING THAT
(a) $(1+i)(1-i) = 2$ and (b) $(p+iq)(1-i) = (p+q) + i(q-p)$
FIG. 3. DUAL CZT of FIG. 2B, WITH THE VARIOUS PARAMETERS SPECIFIED.

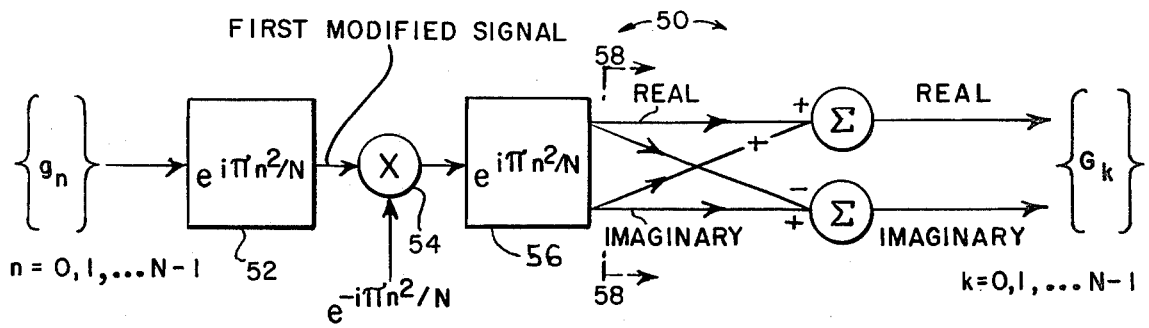
FIG. 4. DUAL CZT USING STANDARD CZT LINES.
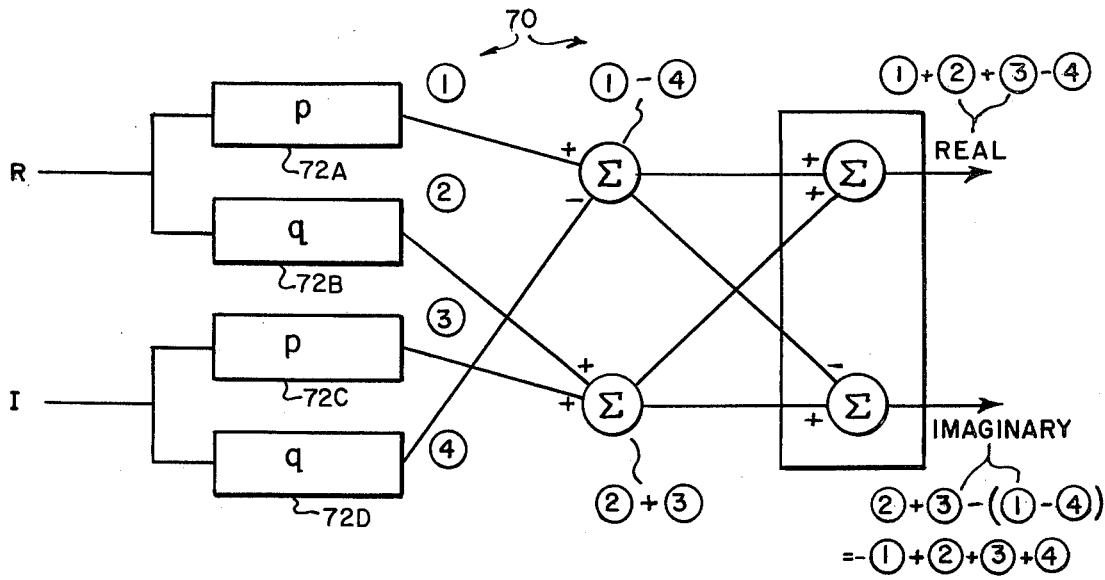
FIG. 5. THE OUTPUT STAGE OF THE DUAL CZT SHOWN IN MORE DETAIL.
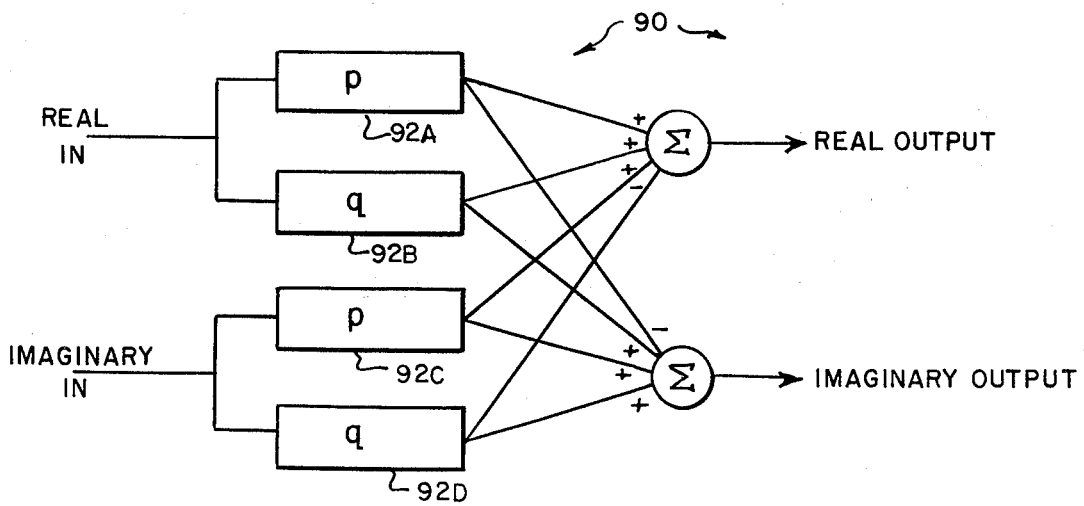
FIG. 6. COMPLEX FILTER WITH IMPULSE RESPONSE (p+iq)(1-i)

4,282,579

DISCRETE FOURIER TRANSFORM SYSTEM USING THE DUAL CHIRP-Z TRANSFORM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The principal prior art method for performing a real-time discrete Fourier transform (DFT) is the chirp-Z transform implemented, for example, as described in U.S. Pat. No. 3,900,721, entitled "Serial-Access Linear Transform," which issued on Aug. 19, 1975, to J. M. Speiser et al. This prior art implementation uses a complex point-by-point premultiplication, followed by a complex transversal filter, followed by a complex point-by-point postmultiplication. The two sets of multiplications, especially the postmultiplication, contribute to the limitations in accuracy and dynamic range of that specific implementation. This prior art implementation is shown in FIG. 1.

Another method for performing the discrete Fourier transform via convolution using a transversal filter is by using the prime transform algorithm. This method is similar to the method using the chirp-Z transform except that the point-by-point multiplications are replaced by permutations. The accuracy of prime transform implementations has been limited by permuter errors.

Errors in the point-by-point pulse multiplication, using the chirp-Z algorithm, or errors in permutation, using the prime transform, are particularly troublesome, since no subsequent convolution is performed to average out the effect of such errors.

Performing the discrete Fourier transform using the prime transform is described in U.S. Pat. No. 4,068,311, entitled "DISCRETE TRANSFORM SYSTEMS USING PERMUTER MEMORIES," which issued on Jan. 10, 1978, to H. J. Whitehouse et al.

SUMMARY OF THE INVENTION

A system for performing the discrete Fourier transform (DFT) of an input signal $g_n$, $n=0, 1, \ldots, N-1$, uses the dual chirp-Z transform. It comprises an input means for convolving the input signal $g_n$ with a reference function $(1-i)\, e^{i\pi n^2/N}$. Means are provided for generating the chirp signal $(1+i)\, e^{-i\pi n^2/N}$. A multiplying means multiplies the output signal from the input means for convolving and the output signal from the means for generating the signal $(1+i)\, e^{-i\pi n^2/N}$.

An output means for circularly convolving convolves its input signal with the reference function $(1-i)\, e^{i\pi n^2/N}$, the output signal of the output means for circularly convolving being proportional to the signal $G_k$, $k=0, 1, \ldots N-1$, which is the discrete Fourier transform of the input signal $g_n$.

The first and second means for convolving may be filters tapped according to the specified configuration.

OBJECTS OF THE INVENTION

An object of the invention is to provide a system for performing the discrete Fourier transform via convolution using a transversal filter.

Another object of the invention is to provide a system for the more accurate implementation of the discrete Fourier transform.

Yet another object of the invention is to provide a system wherein the block length is even, thereby permitting the use of the same transversal filters which would be used for the ordinary chirp-Z transform.

These and other objects of the invention will become more readily apparent from the ensuing specification when taken together with the drawings.

BRIEF DESCRIPTION OF THE DRAWINGS

FIG. 1 is a block diagram of a prior art chirp-Z transform implementation of the discrete Fourier transform (DFT).

FIG. 2 is a pair of block diagrams, FIG. 2A illustrating the time domain interpretation of the chirp-Z transform; whereas FIG. 2B illustrates the frequency domain interpretation of the chirp-Z transform.

FIG. 3 is a block diagram of the dual chirp-Z transform of FIG. 2B, with the various parameters specified.

FIG. 4 is a block diagram of the dual chirp-Z transform using standard CZT filters.

FIG. 5 is a block diagram showing the output stage of the dual chirp-Z transform device of FIG. 4 in more detail.

FIG. 6 is a block diagram of a complex filter with impulse response $(p+iq)(1-i)$.

DESCRIPTION OF THE PREFERRED EMBODIMENTS

The transversal filter provides a high-speed implementation of convolution with a fixed reference function, allowing an efficient realization of linear transforms with shift-invariant kernels. Since the discrete Fourier transform (DFT) is not a shift-invariant transform, it requires the use of one or more time variant operations for its realization. Two such algorithms and their associated device architectures, as has been mentioned hereinabove, have been discussed in the prior art: The chirp-Z transform and the prime transform.

Additional background material is supplied by Whitehouse, H. J., and J. M. Speiser, *Linear Signal Processing Architectures*, in Proceedings of the NATO Advanced Study Institute on Signal Processing, La Spezia, Italy, September 1976.

Reference is again directed to the system 10 of FIG. 1 and the system 20 of FIG. 2A.

The most widely used implementation of the discrete Fourier transform via transversal filters is the chirp-Z transform. The chirp-Z transform uses DFT factorization. The input signal, which may be complex, is labeled $g_n$, $n=1, 2, \ldots, N-1$.

FIGS. 1 and 2A illustrate a chirp-Z transform implementation which uses DFT factorization into a chirp pre-multiplication in multipliers 12 and 22, the chirp signal being designated by reference letter "a," a convolution by a chirp signal in circuits 14 and 24, and a post multiplication by another chirp signal c, in multipliers 16 and 26.

Equations (1), (2), and (3) describe mathematically what is shown in FIGS. 1 and 2A.

$$G_k = \sum_{n=0}^{N-1} g_n e^{-i2\pi nk/N} = e^{-i\pi k^2/N} \sum_{n=0}^{N-1} e^{i\pi(k-n)^2/N}[g_n e^{-i\pi n^2/N}], \quad (1)$$

$$k = 0, 1, \ldots N-1$$

-continued $$G_k = c_k \sum_{n=0}^{N-1} b_{k-n} [a_n g_n] \quad (2)$$

where $$a_n = c_n = b_n^* = e^{-i\pi n^2/N} \quad (3)$$

If the block length, N, is even, then $b_{n+N}$ equals $b_n$ for all n, and the required summation is a circular convolution. Only this case will be considered hereinbelow.

Since there is a one-to-one correspondence between a signal and its discrete Fourier transform, any operation performed upon a signal may also be considered as performing an associated operation on the discrete Fourier transform. In particular, point-wise multiplication and circular convolution are dual operations. If the transform block length is even, as has been assumed for this invention, then the convolution shown in FIG. 2A is a circular convolution of length N, and the dual interpretation of the chirp-Z transform using only circular convolution and point-wise multiplications of length N is possible, as shown in FIG. 2B. Since the input signal, g, was arbitrary, so is its discrete Fourier transform, G. Therefore the block diagram shown in FIG. 2A performs the discrete Fourier transform with an arbitrary input function. In order to determine the filter weights and multiplier coefficients for the dual chirp-Z transform shown in FIG. 2B, it is necessary to calculate the discrete Fourier transforms of the corresponding weights and filter coefficients for the ordinary chirp-Z transform, as shown in Eqs. (4)-(8).

Eq. (8) is a known result in the theory of Gaussian sums, and appears both in the number theory literature, and also in the literature on theta functions. Two useful references are: *An Introduction to the Analytic Theory of Numbers*, by R. Ayoub, American Mathematical Society, Providence, 1963, pp. 315-317; and, *A Brief Introduction to Theta Functions*, Holt, Rinehart and Winston, New York, 1961 (pp. 38-40 on Gaussian Sums), the author being R. Bellman.

$$A_k = C_k = \sum_{n=0}^{N-1} e^{-i\pi n^2/N} e^{-i2\pi nk/N} \quad (4)$$

$$B_k = \sum_{n=0}^{N-1} e^{i\pi n^2/N} e^{-i2\pi nk/N} \quad (5)$$

$$A_k = C_k = e^{i\pi k^2/N} \sum_{n=0}^{N-1} e^{-i\pi(n+k)^2/N} \quad (6)$$

$$= e^{i\pi k^2/N} \sum_{n=0}^{N-1} e^{-i\pi n^2/N}$$

$$B_k = e^{-i\pi k^2/N} \sum_{n=0}^{N-1} e^{i\pi(n-k)^2/N} \quad (7)$$

$$= e^{-i\pi k^2/N} \sum_{n=0}^{N-1} e^{i\pi n^2/N}$$

$$\sum_{n=0}^{N-1} e^{i\pi n^2/N} = (1 + i)\sqrt{N/2} \quad (8)$$

An embodiment 40 of the dual CZT architecture, with resulting specification of filter weights and multiplier coefficients, is shown in FIG. 3. The weights and coefficients may, of course, be scaled by a convenient constant factor, with a corresponding scaling of the output signal.

The factors of $(1-i)$ in the prefilter 42 and $(1+i)$ in the coefficients of the multiplier 44 may be combined by using the identity $(1-i)(1+i)=2$. Also, the multiplication by $(1-i)$ required for the postfilter 46 may be factored out. With these simplifications, the dual chirp-Z transform may be implemented with the same filters which are required for the ordinary chirp-Z transform, as is shown in the embodiment 50 of FIG. 4.

In this same figure, the circuit to the right of line 58 is shown in more detail in the embodiment 70 shown in FIG. 5. An output stage 70 for handling complex numbers is necessary, because the output of the multiplier 54, shown in FIG. 4, may be a complex number.

FIG. 6 illustrates another complex filter 90 which is capable of processing complex input signals.

All operations are complex and may be implemented using four real operations per complex operation, as described in U.S. Pat. No. 3,900,721, described hereinabove; or by using three real operations per complex operation, as described in U.S. Pat. No. 3,926,367, entitled *Complex Filters, Convolvers and Multipliers*, by J. W. Bond et al.

In the embodiments 70 of FIG. 5 and 90 of FIG. 6, the transversal filters 72A-D and 92A-D may be charge-coupled devices.

If real multipliers are used, as shown in the embodiment 10 of the Patent to Bond et al, they may be standard commercially available high-accuracy four-quadrant analog multipliers, such as analog A Devices Model 429B, which is available from Analog Devices, Inc., Route One Industrial Park, P.O. Box 280, Norwood, Mass. 02062.

Although not optimal for the new dual chirp-Z transform architecture, the quad chirped transversal filter manufactured by Reticon Corp., model R5601, may be used for the required filtering operation. The Reticon Corp. is located at 910 Benicia Ave., Sunnyvale, CA. 94086. The tap weightings in this commercially available filter comprise one period of the length 512 complex chirp $e^{i\pi n^2/512}$, so that a means must be provided for reading two successive copies of the signal into the filter in order to provide the required periodic convolution if this filter be used, i.e., a buffer memory is required.

As alternatives, other discretely tapped transversal filters may be used in place of the CCD transversal filters, such as bucket brigade devices.

Another application of the system of this invention is in image sensing using charge transfer concepts, of the kind described in U.S. Pat. No. 3,940,602, to Lagnado et al, entitled SIGNAL PROCESSING IMAGER ARRAY USING CHARGE TRANSFER CONCEPTS, which issued on Feb. 24, 1976.

A CCD image sensor has as an output the discrete convolution of the image with a user supplied reference function. It it were desired to take the Fourier transform of the image, for example for data compression, then the imager described in the patent is used with a chirp for the control function to perform the initial convolution of the dual chirp-Z transform. So that one could take the output of the imager, have it input a discrete multiplier, followed by a transversal filter, resulting in a complex Fourier transform of the image.

In summary, the filter-multiplier-filter Fourier transform architecture which has previously been demonstrated for the continuous Fourier transform has been shown to have an exact analog for an even-length discrete Fourier transform. The prior art continuous Fourier transform is shown by Atzeni, C., et al, *Real Time Network Analyzer Using Dual Analogue Chirp Transform*, Electronics Letter, May 13, 1976, Vol. 12, No. 10, pp. 248-249. The new discrete Fourier transform architecture is called the dual chirp-Z transform. By simulation it can be shown that the overall effect of quantization of the filter tap weights and multiplier coefficients is identical for the ordinary chirp-Z transform and the dual chirp-Z transform.

The dual CZT algorithm performs a discrete Fourier transform via successive convolution, in a first, input, convolver 52, FIG. 4, point-by-point multiplication in multiplier 54, and a second convolution in a second, output, convolver 56. When the transform block size is even, the required reference functions for the convolutions and the point-by-point multiplications become discrete chirps. Because the final operation is a convolution, the dual chirp-Z transform appears potentially attractive for the more accurate implementation of the discrete Fourier transform via transversal filters. When the block length is even, as is assumed in this invention, then the same transversal filters which would be used for the ordinary chirp-Z transform may be used for the dual chirp-Z transform. Only the final summing device in the second complex filter 56 needs to be modified to provide an equivalent change of the tap weights by a factor of $(1+i)$.

Obviously, many modifications and variations of the present invention are possible in the light of the above teachings, and, it is therefore understood that within the scope of the disclosed inventive concept, the invention may be practiced otherwise than as specifically described.

What is claimed is:

1. A system for performing the discrete Fourier transform (DFT) of a discrete input signal $g_n$, $n=0, 1, \ldots, N-1$, where N is an even integer, using the dual chirp-Z transform, comprising:

an input means for circularly convolving the input signal $g_n$ with a reference function $(1-i) e^{i\pi n^2/N}$;

means for generating the chirp signal $(1+i) \times e^{-i\pi n^2/N}$; and means for multiplying the output signal from the input means for circularly convolving and the output signal from the means for generating the signal $(1+i) \times e^{-\pi n^2/N}$; and an output means, whose input is connected to the output of the multiplying means, for circularly convolving its input signal with the reference function $(1-i) e^{i\pi n^2/N}$, the output signal of the output means for circularly convolving being the signal $G_k$, $k=0, 1, \ldots, N-1$, $G_k$ being proportional to the discrete Fourier transform of the input signal $g_n$.

2. The system according to claim 1, wherein:
   the first and second means for convolving are transversal filters tapped with weights which corresponds to the reference function.

3. The system according to claim 1 wherein:
   the first and second means for convolving are charged-coupled device (CCD) cross-convolvers.

4. The system according to claim 1, wherein:
   the first and second means for convolving are digital transversal filters.

5. The system according to claim 1, wherein:
   the first and second means for convolving are discretely tapped surface acoustic wave (SAW) devices.

6. A system for performing the discrete Fourier transform (DFT) of a discrete input signal $g_n$, $n=0, 1, \ldots, N-1$, where N is an even integer, using the dual chirp-Z transform, comprising:

an input means for convolving the input signal $g_n$ with a reference function $e^{i\pi n^2/N}$;

means for generating the chirp signal $e^{-i\pi n^2/N}$;

means, whose input is connected to the output of the input means and to the generating means, for multiplying the output signal from the input means and the signal from the generating means; and an output means, whose input is connected to the output of the multiplying means, for convolving the output signal from the multiplying means with the reference function $e^{i\pi n^2/N}$, the output signal, which may be complex, of the output means for convolving being the signal $G_k$, $k=0, 1, \ldots, N-1$, $G_k$ being proportional to the discrete Fourier transform of the input signal $g_n$.

7. The system according to claim 6, wherein:
   the input and output means for convolving are transversal filters tapped with weights which correspond to the reference function.

* * * * *